(12) United States Patent
Rho

(10) Patent No.: US 7,579,846 B2
(45) Date of Patent: Aug. 25, 2009

(54) OFFSET VOLTAGE MEASURING APPARATUS

(75) Inventor: Kwang-Myoung Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 196 days.

(21) Appl. No.: 11/647,390

(22) Filed: Dec. 29, 2006

(65) Prior Publication Data

US 2008/0012586 A1 Jan. 17, 2008

(30) Foreign Application Priority Data

Jun. 12, 2006 (KR) .................. 10-2006-0052539

(51) Int. Cl.
*G01R 27/08* (2006.01)
*G01R 19/00* (2006.01)

(52) U.S. Cl. .................. 324/713; 324/123 C
(58) Field of Classification Search .......... 324/713, 324/691, 649, 600, 765, 76.11, 73.1, 158.1, 324/76.79, 123 C; 365/205, 207; 330/2, 330/9

See application file for complete search history.

(56) References Cited

U.S. PATENT DOCUMENTS

| | | | |
|---|---|---|---|
| 5,148,115 A * | 9/1992 | Koakutsu et al. ........... 330/2 |
| 6,061,192 A * | 5/2000 | Ogiwara .................. 360/46 |
| 6,288,950 B1 | 9/2001 | Koike | |
| 6,946,799 B2 * | 9/2005 | Shino et al. ............ 315/169.1 |
| 7,042,782 B2 | 5/2006 | Rho | |
| 7,053,600 B2 * | 5/2006 | Takabatake ............ 324/117 H |
| 7,385,410 B2 * | 6/2008 | Payman .................. 324/761 |
| 2002/0053916 A1 * | 5/2002 | Tanizawa ................ 324/713 |
| 2006/0044903 A1 | 3/2006 | Forbes | |
| 2006/0092735 A1 * | 5/2006 | Do et al. ................ 365/207 |

FOREIGN PATENT DOCUMENTS

| | | |
|---|---|---|
| JP | 2004-248098 | 9/2004 |
| JP | 2005-218115 | 8/2005 |
| JP | 2006127725 | 5/2006 |
| KR | 10-1997-0019101 | 4/1997 |
| KR | 1020030088322 | 11/2003 |
| KR | 1020070001460 | 1/2007 |

* cited by examiner

*Primary Examiner*—Timothy J Dole
*Assistant Examiner*—Hoai-An D Nguyen
(74) *Attorney, Agent, or Firm*—Venable LLP; Jeffri A. Kaminski

(57) ABSTRACT

An offset voltage measuring apparatus includes an offset voltage measuring unit including a plurality of measurement nodes having a current variation in response to a feedback voltage. An offset voltage amplifying unit outputs an output voltage amplified in response to an output signal of the offset voltage measuring unit, changes feedback voltage in response to a change in the output voltage and feeds back the feedback voltage to the offset voltage measuring unit.

28 Claims, 2 Drawing Sheets

OFFSET VOLTAGE MEASURING APPARATUS

BACKGROUND

The present invention following relates to a semiconductor integrated circuit, and more particularly, to a semiconductor integrated circuit including an offset voltage measuring apparatus.

A highly integrated memory apparatus such as a dynamic random access memory (DRAM) typically includes a high-precision sense amplifier which can accurately sense and amplify a weak signal stored in a cell, and transmit the signal out. Likewise, a high-performance logic apparatus including an analog-digital-converter (ADC) typically includes a high-precision comparator to increase precision.

In such circuits, offset voltage of an input transistor of an amplifier has to be kept below a critical value to improve precision.

As integrated circuits become more complicated and highly integrated, transistors of an input terminal of the amplifier have become smaller, resulting in higher offset voltage. Thus, to control the offset voltage, an apparatus which can easily and precisely measure the offset voltage is needed in a semiconductor apparatus.

However, conventionally, the offset voltage has been difficult to directly measure by an external apparatus. One approach is to measure the offset voltage indirectly via a test process, or a statistical process. Such processes take a long time. In addition, an exact offset voltage is difficult to measure by such indirect processes.

SUMMARY

Exemplary embodiments provide a semiconductor integrated circuit which can measure an exact offset voltage.

One exemplary embodiment provides a semiconductor integrated circuit which may measure an offset voltage without a process taking a long time.

Another exemplary embodiment provides a semiconductor integrated circuit comprising: an offset voltage measuring unit including a plurality of measurement nodes having a current variation in response to a feedback voltage; and an offset voltage amplifying unit to output an output voltage amplified in response to an output signal of the offset voltage measuring unit, change a feedback voltage in response to a change in the output voltage and feed back the feedback voltage to the offset voltage measuring unit.

Another exemplary embodiment provides an offset voltage measuring apparatus comprising: an offset voltage measuring unit including a plurality of measurement nodes having a current variation in response to first and second feedback voltages; and an offset voltage amplifying unit to output an output voltage with a voltage variation based on an amplification of a differential voltage between the first and second feedback voltages in response to an output signal of the offset voltage measuring unit.

A further understanding of the nature and advantages of the present application may be realized by reference to the remaining portions of the specification and the attached drawings.

BRIEF DESCRIPTION OF THE FIGURES

Non-limiting and non-exhaustive exemplary embodiments are described with reference to the following figures, wherein like reference numerals refer to like units throughout the various figures unless otherwise specified. In the figures.

DETAILED DESCRIPTION OF EXEMPLARY EMBODIMENTS

Figure 1:
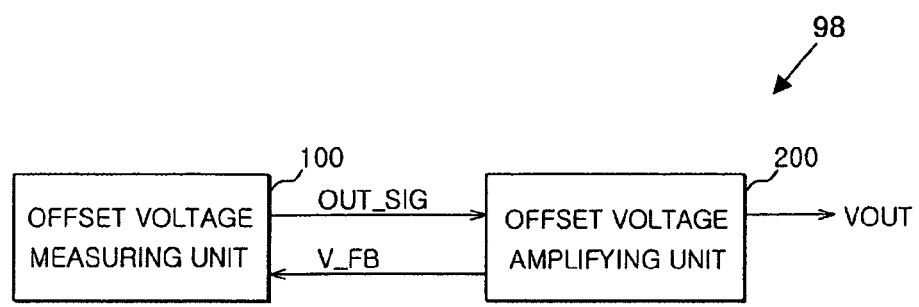
FIG. 1 is a block diagram of a semiconductor integrated circuit including an offset voltage measuring apparatus according to an exemplary embodiment.

Exemplary embodiments will be described below in more detail with reference to the accompanying drawings. The exemplary embodiments may, however, be embodied in different forms and should not be constructed as limited to the embodiments set forth herein. Rather, the exemplary embodiments are provided so that this description will be thorough and complete, and will fully convey the scope of the present application to those skilled in the art. Like reference numerals refer to like elements throughout the accompanying figures.

Referring to FIG. 1, an integrated circuit according to an exemplary embodiment includes an offset voltage measuring unit 100, and an offset voltage amplifying unit 200.

The offset voltage measuring unit 100 includes a plurality of measurement nodes having a current variation in response to a feedback voltage V_FB.

The offset voltage amplifying unit 200 outputs an output voltage VOUT amplified in response to an output signal OUT_SIG of the offset voltage measuring unit 100. The offset voltage amplifying unit 200 adjusts the feedback voltage V_FB and feeds back the adjusted feedback voltage V_FB to the offset voltage measuring unit 100 based on a change in the output voltage VOUT.

That is, in the offset voltage measuring apparatus according to the exemplary embodiment, current is changed at the measurement node of the offset voltage measuring unit 100 in response to the feedback voltage V_FB from the offset voltage amplifying unit 200. The output signal OUT_SIG affects the output voltage VOUT in response to the change in the current. A feedback operation, by which the feedback voltage V_FB is changed, continues performing until the output voltage VOUT is stabilized.

Figure 2:
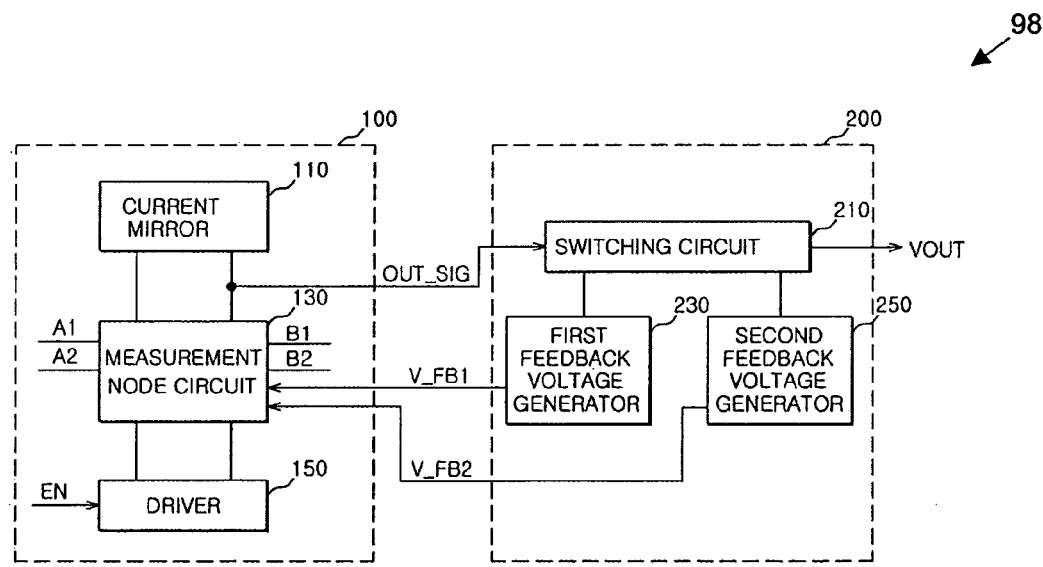
FIG. 2 is a detailed block diagram of the offset voltage measuring apparatus illustrated in FIG. 1.

The feedback voltage V_FB may include a first feedback voltage and a second feedback voltage. Such a semiconductor integrated circuit having two feedback voltages, as illustrated in FIG. 2, includes the offset voltage measuring unit 100 including a plurality of measurement nodes having the variation amount of current in response to first and second feedback voltages V_FB1 and V_FB2. Also, the semiconductor integrated circuit includes the offset voltage amplifying unit 200 which outputs the output voltage VOUT with a variation in response to an amplification of a differential voltage between the first and second feedback voltages V_FB1 and V_FB2 based on the change in the output signal OUT_SIG of the offset voltage measuring unit 100. The offset voltage amplifying unit 200 outputs the first and second feedback voltages V_FB1 and V_FB2, changed based on the output signal OUT_SIG, to the offset voltage measuring unit 100.

Figure 3:
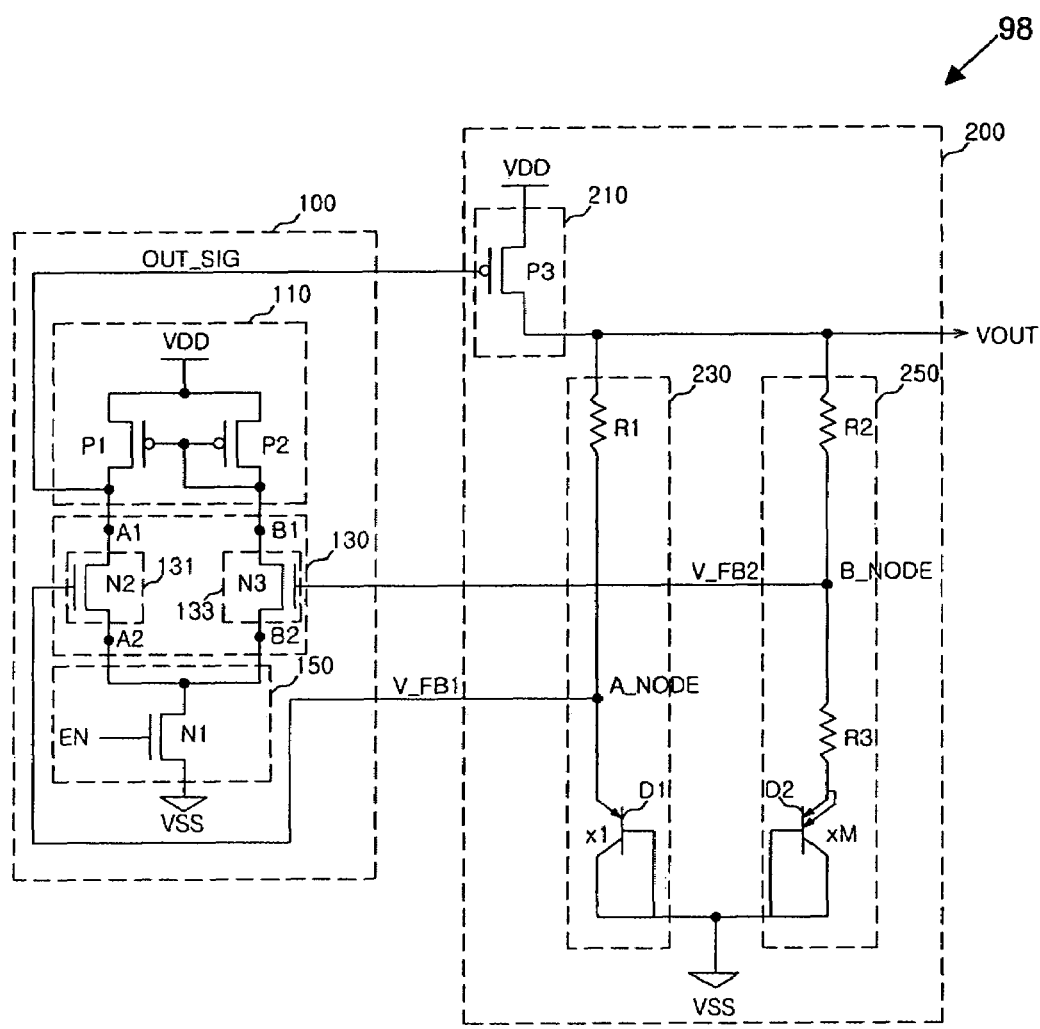
FIG. 3 is a circuit diagram of the offset voltage measuring apparatus illustrated in FIG. 2.

Referring to FIGS. 2 and 3, a semiconductor integrated circuit having two feedback voltages according to another exemplary embodiment is described in detail. The offset voltage measuring unit 100 may include: a current mirror 110 enabling the same current to flow through the measurement nodes; a measurement node circuit 130 connected to the current mirror 110 and including measurement nodes A1, A2, B1 and B2; and a driver 150 connected to the measurement node circuit 130 and receiving a driving signal EN which enables the offset voltage measuring apparatus.

First and second measuring devices 131 and 133 are connected to the measurement nodes A1, A2, B1 and B2 to measure offset voltage. For example, the first measuring device 131 is connected to the first and third measurement nodes A1 and A2, and the second measuring device 133 is connected to the second and fourth measurement nodes B1 and B2.

The offset voltage measuring unit 100 is configured as a differential amplifier, and outputs the output signal OUT_SIG from a node to which the current mirror 110 and the measurement node circuit 130 are connected.

The offset voltage amplifying unit 200 may include: a switching circuit 210 to receive an external power supply voltage VDD and output the output voltage VOUT in response to the output signal OUT_SIG; a first feedback voltage generator 230 connected between the switching circuit 210 and a ground terminal VSS to output the first feedback voltage V_FB1; and a second feedback voltage generator 250 connected in parallel with the first feedback voltage generator 230 between the switching circuit 210 and the ground terminal VSS to output the second feedback voltage V_FB2.

The first feedback voltage generator 230 changes and outputs the first feedback voltage V_FB1 by a predetermined level based on the modified output voltage VOUT. The second feedback voltage generator 250 changes and outputs the second feedback voltage V_FB2 by a value more than a predetermined level based on the modified output voltage VOUT.

Referring to FIG. 3, the current mirror 110 may include first and second PMOS transistors P1 and P2. The first PMOS transistor P1 has a source terminal connected with the external power supply voltage VDD, and a drain terminal connected with the first measurement node A1. The second PMOS transistor P2 has a source terminal connected with the external power supply voltage VDD, a drain terminal connected with the second measurement node B1, and a gate terminal connected to the second measurement node B1 and a gate terminal of the first PMOS transistor P1.

The driver 150 may have a first NMOS transistor N1, in which a gate terminal receives the driving signal EN, and a drain terminal is connected with the third and fourth measurement nodes A2 and B2.

The third and fourth measurement nodes A2 and B2 of the driver 150 may be connected with the ground terminal VSS, omitting the connection with the first NMOS transistor N1.

The measurement node circuit 130 may include four measurement nodes A1, A2, B1 and B2. The first measuring device 131 is connected to the first and third measurement nodes A1 and A2, and the second measuring device 133 is connected to the second and fourth measurement nodes B1 and B2.

The switching circuit 210 may include a third PMOS transistor P3, in which a gate terminal receives the output signal OUT_SIG, and a source terminal is connected to the external power supply voltage VDD.

The first feedback voltage generator 230 may include a first resistive device R1 (i.e., resistor) connected between a drain terminal of the third PMOS transistor P3 and a first node A_NODE, and a first bipolar junction transistor D1 having a diode configuration, in which an emitter terminal is connected to the first node A_NODE, and base and collector terminals are connected to the ground terminal VSS.

The second feedback voltage generator 250 may include a second resistive device R2 (i.e., resistor) connected between the drain terminal of the third PMOS transistor P3 and a second node B_NODE, a third resistive device R3 (i.e., resistor) connected with the second node B_NODE, and a second bipolar junction transistor D2, in which an emitter terminal is connected to a third resistive device R3, and base and collector terminals are connected to the ground terminal VSS.

The first feedback voltage V_FB1 is output from the first node A_NODE, and the second feedback voltage V_FB2 is output from the second node B_NODE.

The first, second and third resistive devices R1, R2, R3 serve to amplify a differential voltage between the first and second feedback voltages V_FB1 and V_FB2. The first and second resistive devices R1 and R2 may have the same resistance values.

Although the first and second bipolar junction transistors D1 and D2 are shown as PNP type transistors, NPN type transistors or other type diodes are contemplated.

Although the offset voltage amplifying unit 200 is formed of a circuit generating a bandgap reference voltage in the exemplary embodiment, it may be changed according to the intention of the designer.

The offset voltage measuring apparatus compares the first feedback voltage V_FB1 with the second feedback voltage V_FB2 which provide respective inputs to the first and second measuring devices 131 and 133, and generates the output voltage VOUT by amplifying the output signal OUT_SIG. The levels of the first and second feedback voltages V_FB1 and V_FB2 which are output in response to the modified output voltage VOUT may be modified to be fed back. If the first and second measuring devices 131 and 133 have offset voltages, since a final differential voltage of the first and second feedback voltages V_FB1 and V_FB2 is equal to the offset voltage of the first and second measuring devices 131 and 133 due to the feedback operation. Thus, the offset voltage can be calculated by a simple formula, when the output voltage VOUT is changed and stabilized.

In the exemplary embodiment, the first and second measuring devices 131 and 133 each includes a NMOS transistor N2, N3.

The offset voltage measuring apparatus according to the exemplary embodiment, as illustrated in FIG. 2, may include the second NMOS transistor N2 and the third NMOS transistor N3. To measure an offset voltage of the second NMOS transistor N2, the second NMOS transistor N2 is connected to the first and third measurement nodes A1 and A2. The third NMOS transistor N3 is connected to the second and fourth measurement nodes B1 and B2. The first, second and third NMOS transistors N1, N2 and N3, and the first and second PMOS transistors P1 and P2 have a configuration of a differential amplifier.

The offset voltage amplifying unit 200 generates and outputs the output voltage VOUT in response to the output signal OUT_SIG of the offset voltage measuring unit 100, and provides first and second feedback voltages V_FB1 and V_FB2 changed according to the change in the output voltage VOUT to gate terminals of the second and third NMOS transistors N2 and N3. In response to the first feedback voltage V_FB1 input to the second NMOS transistor N2 and the second feedback voltage V_FB2 input to the third NMOS transistor N3, the level of the output signal OUT_SIG is determined. A third PMOS transistor P3 included in the switching circuit 210 is turned on and off to output the output voltage VOUT in response to the output signal OUT_SIG to facilitate a feedback operation.

The first feedback voltage V_FB1 of the first feedback voltage generator 230 and the second feedback voltage V_FB2 of the second feedback voltage generator 250 are changed in response to the change in the output voltage VOUT, and are being fed back to the second and third NMOS transistors N2 and N3, respectively.

In the offset voltage measuring apparatus according to the exemplary embodiment, assume that the first feedback voltage V_FB1 is higher than the second feedback voltage V_FB2 in an initial state, and there is no offset voltage between the second and third NMOS transistors N2 and N3. The output signal OUT_SIG, based on a voltage comparison result between the second NMOS transistor N2, in which a gate terminal receives the first feedback voltage V_FB1, and the third NMOS transistor N3, in which a gate terminal receives the second feedback voltage V_FB2, is at a low level. The voltage applied from the external power supply voltage VDD in response to the output signal OUT_SIG is provided through the third PMOS transistor P3, so that the output voltage VOUT is increased. The first and second feedback voltages V_FB1 and V_FB2, which are respectively output through the first and second resistive devices R1 and R2, are increased in response to the increase in the output voltage VOUT. The first feedback voltage V_FB1 is increased less than the second feedback voltage V_FB2. More specifically, although the first and second feedback voltages V_FB1 and V_FB2 are increased by the first and second resistive devices R1 and R2, the first feedback voltage V_FB1 is output by the first resistive device R1 and a first bipolar junction transistor D1, which is insensitive to a change in current. The second feedback voltage V_FB2 is output by the second and third resistive devices R2, R3 and a second bipolar junction transistor D2, which is insensitive to a change in current. Therefore, the second feedback voltage V_FB2 is increased relatively more than the first feedback voltage V_FB1 due to the third resistive device R3.

The first and second feedback voltages V_FB1 and V_FB2 are input to the second and third NMOS transistors N2, N3. The above-described operations are repeated, the differential voltage between the first and second feedback voltages V_FB1, V_FB2 is decreased and the output voltage VOUT is stabilized.

Alternatively, in the offset voltage measuring apparatus, assume that the second feedback voltage V_FB2 is higher than the first feedback voltage V_FB1 in an initial state, and there is no offset voltage between the second and third NMOS transistors N2 and N3. The output signal OUT_SIG based on the voltage comparison result between the second NMOS transistor N2, in which a gate terminal receives the first feedback voltage V_FB1, and the third NMOS transistor N3, in which a gate terminal receives the second feedback voltage V_FB2, is at a high level. The voltage applied from the external power supply voltage VDD based on the output signal OUT_SIG is interrupted by the third PMOS transistor P3, and thus the output voltage VOUT is decreased. The first and second feedback voltages V_FB1 and V_FB2, which are output through the first and second restive devices R1 and R2, respectively, are decreased in response to the decrease in the output voltage VOUT. The first feedback voltage V_FB1 is decreased less than the second feedback voltage V_FB2. More specifically, although the first and second feedback voltages V_FB1 and V_FB2 are decreased by the first and second resistive devices R1 and R2, the first feedback voltage V_FB1 is output by the first resistive device R1 and the first bipolar junction transistor D1, which is insensitive to a change in current. The second feedback voltage V_FB2 is output by the second and third resistive devices R2 and R3, and the second bipolar junction transistor D2, which is insensitive to a change in current. Thus, the second feedback voltage V_FB2 is decreased relatively more than the first feedback voltage V_FB1 due to the third resistive device R3.

The first and second feedback voltages V_FB1 and V_FB2 are input to the second and third NMOS transistors N2 and N3. The above-described operations are repeated. The differential voltage between the first and second feedback voltages V_FB1 and V_FB2 is decreased, and the output voltage VOUT is stabilized.

If an offset voltage (VOS) does not exist between the second and third NMOS transistors N2 and N3, which is an ideal state, the offset voltage measuring apparatus operates to reduce the differential voltage between the first and second feedback voltages V_FB1 and V_FB2. However, if there is an offset voltage (VOS) between the second and third NMOS transistors N2 and N3, the offset voltage measuring apparatus operates such that the differential voltage between the first and second feedback voltages V_FB1 and V_FB2 is equal to the offset voltage (VOS) between the second and third NMOS transistors N2 and N3.

That is, the offset voltage measuring apparatus according to the exemplary embodiment may measure the differential voltage between the first and second feedback voltages V_FB1, V_FB2 and the amplified output voltage VOUT, thereby measuring the offset voltage (VOS) between the second and third NMOS transistors N2 and N3.

The offset voltage (VOS) between the first and second feedback voltages V_FB1 and V_FB2 according to the change in the output voltage VOUT in the offset voltage amplifying unit 200 is:

$$VOUT = VBE1 = R2*VT*ln(M)/R3 - R2*VOS/R3$$

VOUT denotes the output voltage, and R2 and R3 denote resistance values of the resistive devices R2 may be replaced by R1 having the same resistance.

VBE1 denotes a base-emitter voltage of the first bipolar junction transistor D1, and M denotes an area ratio of the second bipolar junction transistor D2 with respect to the first bipolar junction transistor D1.

VT denotes a thermal voltage, and VOS denotes an offset voltage to be measured.

The offset voltage measuring apparatus according to the exemplary embodiment replaces a fine offset voltage (VOS) between a measurement element pair with a level variation in the output voltage VOUT. As a result, the offset voltage (VOS) may be measured by measuring the output voltage VOUT which is relatively easy to be measured. In general, to generate the output voltage which is stable to changes in process, voltage and temperature, a resistance ratio of the first and third resistive devices R1 and R3 may not be freely adjusted. When the output voltage VOUT is used to measure the offset voltage, the resistance ratio of the first and third resistive devices R1 and R3 may be freely selected.

If the conventional offset voltage is 10 mV, and the resistance value of the first resistive device R1 is about fifty times larger than that of the third resistive device R3, the variation in the output voltage VOUT caused by the offset voltage (VOS) may be about 500 mV, which results in a voltage difference easily measurable.

As described above, the offset voltage measuring apparatus according to the exemplary embodiment outputs the first and second feedback voltages V_FB1 and V_FB2 which have different voltage levels based on the change of the output voltage VOUT, and outputs a signal controlling the output voltage VOUT based on the first and second feedback voltages V_FB1 and V_FB2. Accordingly, the offset voltages of the first and second measuring devices 131 and 133 receiving the first and second feedback voltages V_FB1 and V_FB2 can be easily measured.

The offset voltage measuring apparatus according to the exemplary embodiment provides a circuit capable of easily measuring an offset voltage of a highly integrated and high-precision amplifier circuit, providing easier solutions for controlling an offset voltage in highly integrated memory products and high-precision ASIC products.

The above-disclosed subject matter is to be considered illustrative, and not restrictive, and the appended claims are intended to cover all such modifications, enhancements, and other embodiments, which fall within the true spirit and scope of the described. Thus, to the maximum extent allowed by law, the scope of the present application is to be determined by the broadest permissible interpretation of the following claims and their equivalents, and shall not be restricted or limited by the foregoing detailed description.

What is claimed is:

1. An offset voltage measuring apparatus comprising:
   an offset voltage measuring unit including a plurality of measurement nodes having a current variation in response to a first feedback voltage and a second feedback voltage; and
   an offset voltage amplifying unit to output an output voltage amplified in response to an output signal of the offset voltage measuring unit, to generate and adjust the first and second feedback voltages in response to a change in the output voltage, and to feed back the adjusted feedback voltages to the offset voltage measuring unit, the offset voltage amplifying unit comprises:
   a switching circuit receiving an external power supply voltage and outputting the output voltage in response to the output signal;
   a first feedback voltage generator connected between the switching circuit and a ground voltage, and outputting the first feedback voltage; and
   a second feedback voltage generator connected in parallel with the first feedback voltage generator between the switching circuit and ground, and outputting the second feedback voltage.

2. The apparatus as set forth in claim 1, wherein the offset voltage measuring unit comprises:
   a current mirror to enable the same current to flow through the measurement nodes;
   a measurement node circuit connected to the current mirror; and
   a driver connected to the measurement node circuit to receive a driving signal.

3. The apparatus as set forth in claim 2, wherein at least one measurement node is connected with a measuring device.

4. The apparatus as set forth in claim 1, wherein the offset voltage measuring unit comprises a differential amplifier.

5. The apparatus as set forth in claim 1, wherein the first feedback voltage generator changes and outputs the first feedback voltage by a predetermined level in response to the change in the output voltage.

6. The apparatus as set forth in claim 2, wherein the measurement node circuit comprises:
   first and second measurement nodes connected with the current mirror; and
   third and fourth measurement nodes connected with the driver.

7. The apparatus as set forth in claim 6, further comprising a first measuring device connected to the first and third measurement nodes.

8. The apparatus as set forth in claim 7, further comprising:
   a second measuring device connected to the second and fourth measurement nodes.

9. The apparatus as set forth in claim 8, wherein at least one of the first and second measuring device includes a transistor.

10. The apparatus as set forth in claim 9, wherein the current mirror comprises:
    a first PMOS transistor having a gate terminal, a source terminal connected to an external power supply voltage, and a drain terminal connected with the first measurement node; and
    a second PMOS transistor having a source terminal connected to the external power supply voltage, a drain terminal connected with the second measurement node, and a gate terminal connected with the second measurement node and the gate terminal of the first PMOS transistor.

11. The apparatus as set forth in claim 10, wherein the driver comprises:
    a first NMOS transistor having a gate terminal receiving a driving signal,
    a drain terminal connected to the third and fourth measurement nodes; and
    a source terminal connected to a ground voltage terminal.

12. The apparatus as set forth in claim 9, wherein the first measuring device includes an NMOS transistor having:
    a gate terminal receiving the first feedback voltage;
    a drain terminal connected to the first measurement node; and
    a source terminal connected to the third measurement node.

13. The apparatus as set forth in claim 9, wherein the second measuring device includes an NMOS transistor having:
    a gate terminal receiving the second feedback voltage;
    a drain terminal connected to the second measurement node; and
    a source terminal connected to the fourth measurement node.

14. The apparatus as set forth in claim 5, wherein the second feedback voltage generator changes and outputs the second feedback voltage by a value that exceeds the predetermined level in response to the change in the output voltage.

15. The apparatus as set forth in claim 14, wherein the switching circuit comprises a PMOS transistor having:
    a gate terminal to receive the output signal; and
    a source terminal connected to the external power supply voltage.

16. The apparatus as set forth in claim 15, wherein the first feedback voltage generator comprises:
    a first resistive device connected to the drain terminal of the PMOS transistor; and
    a first transistor having a diode configuration and connected between the first resistive device and the ground voltage terminal.

17. The apparatus as set forth in claim 16, wherein the second feedback voltage generator comprises:
    a second resistive device connected to the drain terminal of the PMOS transistor;
    a third resistive device connected in series with the second resistive device; and
    a second transistor having a diode configuration and connected between the third resistive device and the ground voltage terminal.

18. The apparatus as set forth in claim 17, wherein the first and second resistive devices have the same resistance values.

19. The apparatus as set forth in claim 18, wherein the first feedback voltage is output from a connecting terminal of the first restive device and the first transistor.

20. The apparatus as set forth in claim 19, wherein the second feedback voltage is output from a connecting terminal of the second and third resistive devices.

21. The apparatus as set forth in claim 20, wherein at least one of the first and second transistor includes a bipolar junction transistor.

22. An offset voltage measuring apparatus comprising:
an offset voltage measuring unit including a plurality of measurement nodes having a current variation in response to first and second feedback voltages; and
an offset voltage amplifying unit to output an output voltage with a voltage variation based on an amplification of a differential voltage between the first and second feedback voltages in response to an output signal of the offset voltage measuring unit,
wherein the offset voltage measuring unit comprises a current mirror to facilitate the same current to flow through the measurement nodes, a measurement node circuit connected to the current mirror; and a driver connected to the measurement node circuit to receive a driving signal.

23. The apparatus as set forth in claim 22, wherein the offset voltage amplifying unit comprises:
a switching circuit to receive an external power supply voltage and output the output voltage based on a change in the output signal;
a first feedback voltage generator connected between the switching circuit and a ground voltage to output the first feedback voltage; and
a second feedback voltage generator connected in parallel with the first feedback voltage generator between the switching circuit and a ground voltage terminal to output the second feedback voltage.

24. The apparatus as set forth in claim 22, wherein the offset voltage amplifying unit outputs the first and second feedback voltages in response to a change in the output voltage.

25. The apparatus as set forth in claim 23, wherein the first feedback voltage generator changes and outputs the first feedback voltage by a predetermined level in response to the change in the output voltage.

26. The apparatus as set forth in claim 22, further comprising:
first and second measurement devices each connected to a corresponding measurement node.

27. The apparatus as set forth in claim 22, wherein the offset voltage measuring unit has a configuration of a differential amplifier.

28. The apparatus as set forth in claim 25, wherein the second feedback voltage generator changes and outputs the second feedback voltage by a value that exceeds the predetermined level in response to the change in the output voltage.

* * * * *